United States Patent
Ma et al.

(10) Patent No.: US 9,948,246 B1
(45) Date of Patent: Apr. 17, 2018

(54) IMPEDANCE FLATTENING NETWORK FOR HIGH EFFICIENCY WIDEBAND DOHERTY POWER AMPLIFIER

(71) Applicant: Mitsubishi Electric Research Laboratories, Inc., Cambridge, MA (US)

(72) Inventors: Rui Ma, Lexington, MA (US); Sheikh Nijam Ali, Pullman, WA (US); Koon Hoo Teo, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/296,209

(22) Filed: Oct. 18, 2016

(51) Int. Cl.
H03F 1/42 (2006.01)
H03F 1/02 (2006.01)
(Continued)

(52) U.S. Cl.
CPC ........... *H03F 1/42* (2013.01); *H01L 29/2003* (2013.01); *H01L 29/778* (2013.01); *H03F 1/0288* (2013.01); *H03F 1/565* (2013.01); *H03F 3/19* (2013.01); *H03F 3/245* (2013.01); *H03F 2200/387* (2013.01); *H03F 2200/451* (2013.01); *H04W 88/08* (2013.01)

(58) Field of Classification Search
CPC .......... H03F 1/42; H03F 1/0288; H03F 1/565; H03F 3/19; H03F 3/245; H01L 29/2003; H01L 29/778
See application file for complete search history.

(56) References Cited

U.S. PATENT DOCUMENTS 6,252,461 B1* 6/2001 Raab .................... H03F 1/0205
330/124 R
8,314,654 B2 11/2012 Outaleb et al.
(Continued)

FOREIGN PATENT DOCUMENTS

EP 2413498 A1 2/2012

OTHER PUBLICATIONS

Rubio, J.M.; Fang, J.; Camarchia, V.; Quaglia, R.; Pirola, M.; Ghione, G., "3-3.6-GHz Wideband GaN Doherty Power Amplifier Exploiting Output Compensation Stages," in Microwave Theory and Techniques, IEEE Transactions on , vol. 60, No. 8, pp. 2543-2548, Aug. 2012.
(Continued)

*Primary Examiner* — Devan Sandiford
(74) *Attorney, Agent, or Firm* — Gene Vinokur; James McAleenan; Hironori Tsukamoto (57) ABSTRACT

A wideband power amplifier includes a set of amplifiers connected in parallel to amplify signals from input ports of the amplifiers, a matching network configured to match the signals amplified by the amplifiers with predetermined load values, the matching network having a first impedance frequency response as a monotonically decreasing function of frequency of the amplified signals in a target operation frequency range, a converter network configured to convert the signals matched by the matching network, and an impedance flattening network having a second impedance frequency response as a monotonically increasing function of frequency of the amplified signals in the target operation frequency range.

17 Claims, 11 Drawing Sheets

(51) Int. Cl.
*H03F 3/19* (2006.01)
*H03F 3/24* (2006.01)
*H03F 1/56* (2006.01)
*H01L 29/778* (2006.01)
*H01L 29/20* (2006.01)
*H04W 88/08* (2009.01)

(56) References Cited

U.S. PATENT DOCUMENTS

| | | | |
|---|---|---|---|
| 8,896,373 B2 | 11/2014 | Mei | |
| 9,112,458 B2 | 8/2015 | Seneviratne et al. | |
| 2004/0051583 A1* | 3/2004 | Hellberg | H03F 1/0288 330/124 R |
| 2009/0085667 A1* | 4/2009 | Krvavac | H03F 1/0288 330/295 |
| 2009/0115512 A1* | 5/2009 | Grondahl | H03F 1/0261 330/124 R |
| 2009/0121791 A1* | 5/2009 | Lu | H03F 1/223 330/311 |
| 2009/0179702 A1* | 7/2009 | Blednov | H03F 1/0288 330/277 |
| 2010/0052779 A1* | 3/2010 | Shin | H03F 1/0288 330/124 R |
| 2010/0141338 A1* | 6/2010 | Yu | H03F 1/0288 330/124 R |
| 2012/0126890 A1* | 5/2012 | Svechtarov | H03F 1/0288 330/124 R |
| 2012/0235734 A1* | 9/2012 | Pengelly | H03F 1/0288 330/124 D |
| 2012/0313701 A1* | 12/2012 | Khlat | H02M 3/07 330/127 |
| 2013/0099860 A1* | 4/2013 | Shiikuma | H01P 5/02 330/124 R |
| 2014/0132344 A1 | 5/2014 | Outaleb | |
| 2014/0253246 A1* | 9/2014 | Mei | H03F 1/0288 330/295 |
| 2014/0347133 A1* | 11/2014 | Qureshi | H03F 3/193 330/295 |
| 2015/0017934 A1* | 1/2015 | Yamaoka | H03F 3/245 455/114.3 |
| 2015/0091651 A1* | 4/2015 | Seneviratne | H03F 1/42 330/295 |
| 2015/0091653 A1* | 4/2015 | Kobayashi | H03F 1/0288 330/295 |
| 2015/0091667 A1* | 4/2015 | Seneviratne | H01P 5/02 333/35 |
| 2015/0145602 A1* | 5/2015 | Felgentreff | H03F 1/42 330/295 |
| 2015/0180428 A1* | 6/2015 | Pham | H03F 3/211 330/295 |
| 2015/0188504 A1* | 7/2015 | Kesson | H03F 1/0288 330/286 |
| 2015/0229282 A1* | 8/2015 | Kaehs | H03F 1/0288 375/297 |
| 2015/0263678 A1* | 9/2015 | Kunihiro | H03F 3/24 330/295 |
| 2015/0295547 A1* | 10/2015 | Blednov | H03F 1/0288 330/286 |
| 2015/0340996 A1* | 11/2015 | Ge | H03F 1/0288 330/295 |
| 2016/0276985 A1* | 9/2016 | Fager | H03F 1/0288 |
| 2017/0019071 A1* | 1/2017 | Kobayashi | H03F 1/56 |
| 2017/0163220 A1* | 6/2017 | Yamamoto | H03F 1/0288 |

OTHER PUBLICATIONS

Boumaiza Slim et al., Multispectrum Signal Transmitters: Advances in Broadband High-Efficiency Power Amplifiers for Carrier Aggregated Signals, IEEE Microwave Magazine, IEEE Service Center, Piscaaway, NJ, US. vol. 15, No. 7, Nov. 1, 2014.

Goulin Sun et al., Broadband Doherty Power Amplifier is Real Frequency Technique, IEEE Transactions on Microwave Theory and Techniques, Plenum, US. vol. 60, No. 1. Jan. 1, 2012. pp. 99-111.

Abadi Mehdi Naseri Ali et al., An Extended Bandwidth Doherty Power Amplifier using a Novel Output Combiner, 2014 IEEE MTT-S International Microwave Symposium, IEEE, Jun. 1, 2014. pp. 1-4.

* cited by examiner

IMPEDANCE FLATTENING NETWORK FOR HIGH EFFICIENCY WIDEBAND DOHERTY POWER AMPLIFIER

FIELD OF THE INVENTION

This invention relates to impedance flattening network for high efficiency wideband Doherty power amplifier for the application of wireless communications.

BACKGROUND OF THE INVENTION

Demand of high bandwidth and application of high peak-to-average power ratio (PAPR) modulated signals in wireless cellular communication have generated intense interest towards wideband Doherty power amplifier (PA). The benefit of high back-off efficiency from Doherty PA manifest themselves as a prime candidate for the next generation high efficiency power amplifiers for the applications of cellular base stations.

The conventional Doherty PA uses the load modulation concept to maintain high efficiency both at peak and back-off power. However, a conventional load modulation network is only suitable for narrow band operation. Therefore, there is significant demand of Doherty PA which can support wide bandwidth and high efficiency simultaneously to meet the requirements of next generation wireless communications.

However, one of the most important design challenges with the Doherty power amplifier is narrow bandwidth performance at back-off power. Several methods are realized to overcome the narrow band operation at back-off power, among them reduced impedance transformation ratio at back-off power and output compensation stage are prominent. Reduced impedance transformation ratio helps to overcome the problem to some extent but it still shows significant variation of real part of impedance at back-off power, as the frequency moves from its center. Similar characteristics are also observed in case of output impedance compensation network scenario and as a result these techniques end-up with low efficiency at back-off power in practical applications. Therefore, it is very attractive to implement a wideband Doherty power amplifier with minimal variation of real part of impedance at back-off power to maintain high efficiency over wide frequency range.

Figure 1:
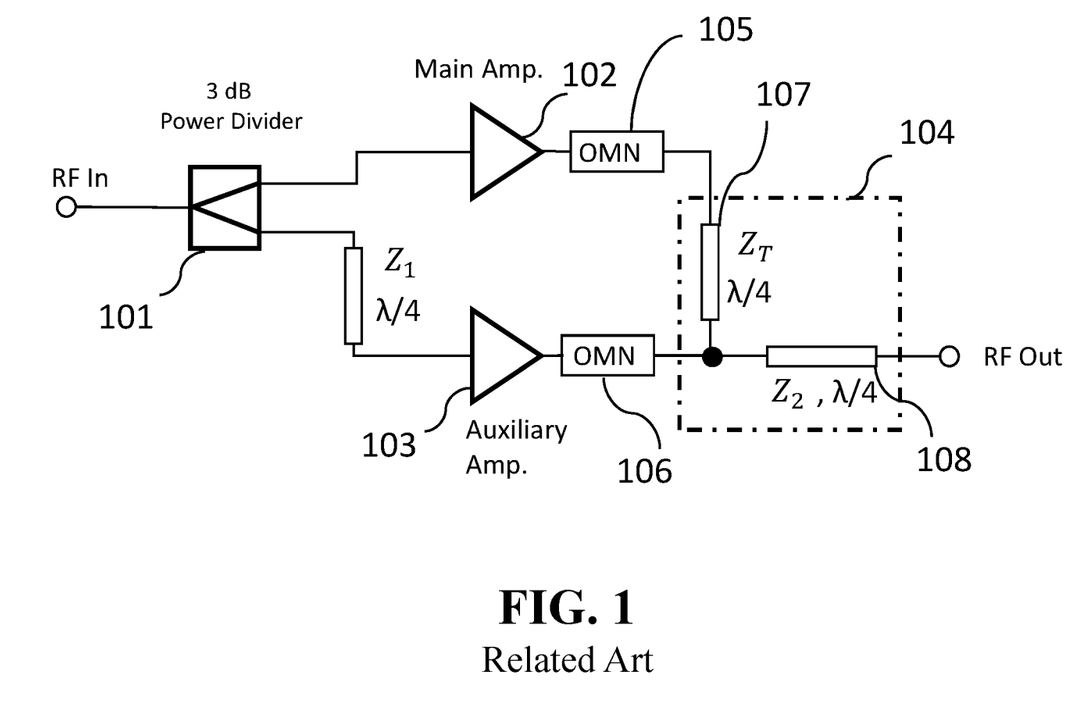
FIG. 1 shows a Doherty power amplifier of a related art.

FIG. 1 shows a related art Doherty power amplifier which includes a 3 dB power divider 101 followed by main 102 and auxiliary 103 power amplifiers and a combining network known as Doherty combiner 104. The main and auxiliary amplifiers are typically biased at class AB and class C mode respectively. Also, output matching networks (OMNs) 105, 106 require at the output of main and auxiliary amplifier to match the optimum load of these PAs into desire final load value. The Doherty combiner works as a load modulation network which provides required load conditions for both peak and back-off power levels. As a result, high efficiency can be maintained over a certain power range for signal with high PAPR; typically, 6-dB PAPR or more. However, due to the inherent narrow band characteristic of the λ/4 impedance inverter $Z_T$ 107 at back-off, the conventional Doherty combining network is only suitable for narrow band operation; typically 1-5% relative bandwidth.

Figure 2A:
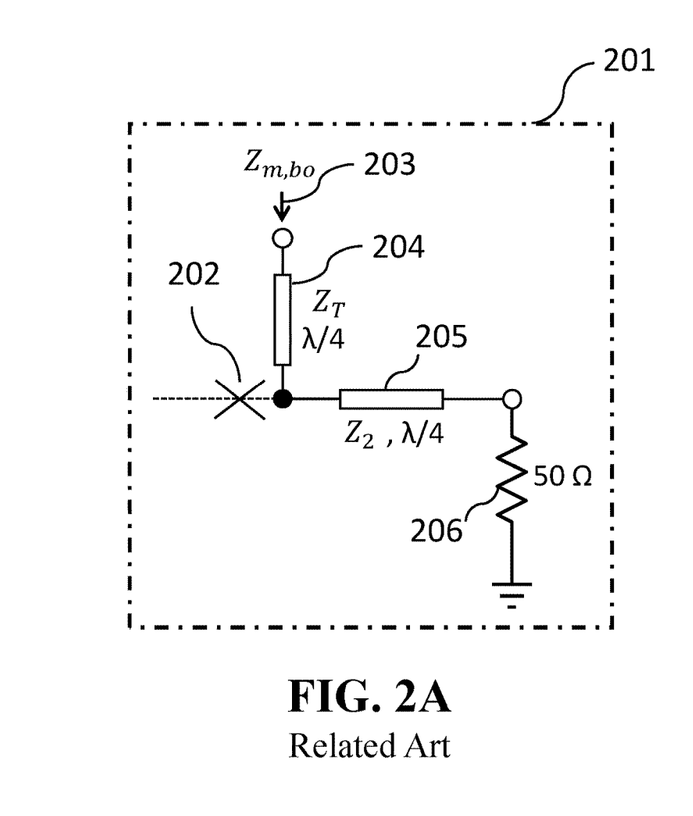
FIG. 2A shows an equivalent configuration of the Doherty combiner network at the back-off power level.
Figure 2B:
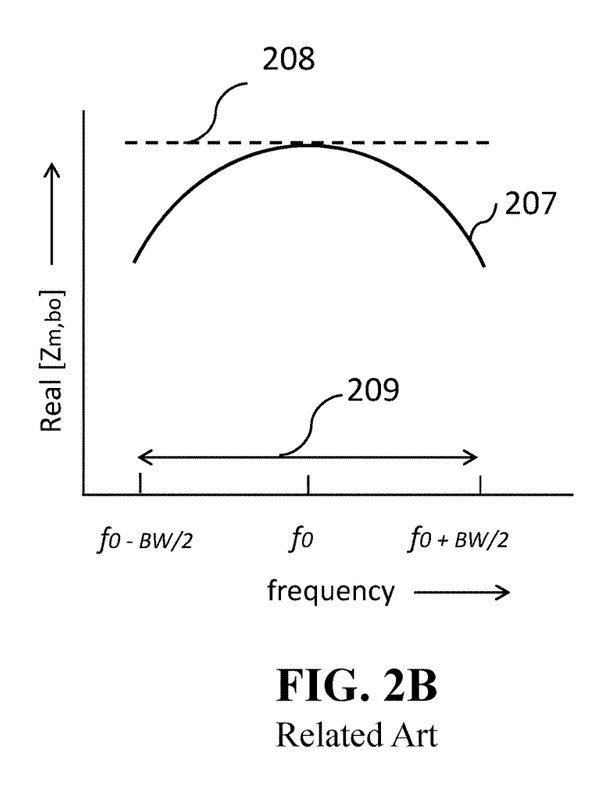
FIG. 2B shows the comparison of the input impedance of Doherty combiner frequency responses in actual case and in wideband case.

FIG. 2A shows the equivalent connection at back-off power level, at which the auxiliary amplifier 103 is at off status showing theoretically infinite output impedance. Therefore, the auxiliary amplifier 103 is disconnected from the Doherty combiner 104, as indicted at a portion 202 in FIG. 2A. The Doherty combiner impedance response (real part) denoted by $[Z_{m,bo}]$ at a portion 203 is shown in FIG. 2B. The nature of the input impedance frequency-dependency of the quarter-wave transmission lines 204 and 205 consisting the Doherty combiner 104 is given by a frequency response curve 207 over the design frequency range 209. Ideally, to design a wide bandwidth efficient operation of Doherty PA, the real part of the impedance $[Z_{m,bo}]$ needs to be frequency independent over the frequency range 209, which should be a flat curve as indicated by a dashed line 208. However, this is very challenging to achieve in practice.

Figure 3:
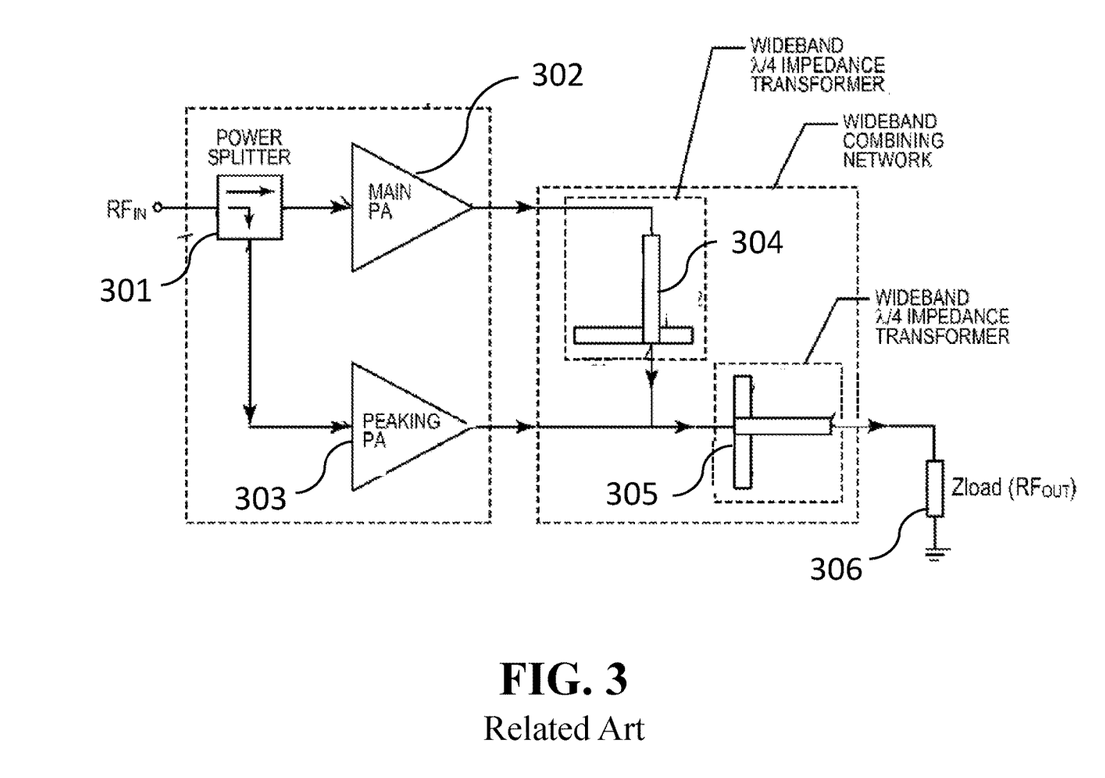
FIG. 3 shows a wideband Doherty power amplifier of a related art.

FIG. 3 shows a related art reported in U.S. Pat. No. 9,112,458, in which a wideband Doherty power amplifier is realized by introducing a compensation circuit which is configured to reduce the total quality factor of the wideband quadrature-wave impedance transformer as compared to the quality factor of the quarter-wave impedance transformer. In general, compromising the quality factor of any system usually enhances bandwidth but it generates complications. One of the major consequences is that it increases the loss of the system and specially, in case of power amplifier where efficiency is very crucial, any low quality factor network will introduce efficiency degradation, which will not be suitable for next generation low cost energy efficient wireless systems.

Thus, there is a need for an advanced Doherty power amplifier architecture which has wideband combining network while maintaining high efficiency at back-off power, small form factor and reduced complexity design.

SUMMARY OF THE INVENTION

Some embodiments are based on recognition that a wideband power amplifier having an impedance flattening network improves the characteristics of the bandwidth and back-off efficiency of a Doherty power amplifier. The wideband power amplifier comprises a set of amplifiers connected in parallel to amplify signals from input ports of the amplifiers; a matching network configured to match the signals amplified by the amplifiers with predetermined load values, the matching network having a first impedance frequency response as a monotonically decreasing function of frequency of the amplified signals in a target operation frequency range; a converter network configured to convert the signals matched by the matching network; and an impedance flattening network having a second impedance frequency response as a monotonically increasing function of frequency of the amplified signals in the target operation frequency range.

Another embodiment discloses a method for designing a power amplifier having an impedance flattening network. The method comprises steps of arranging a set of amplifiers connected in parallel to amplify signals from input ports of the amplifiers; arranging a matching network to connect with the amplifiers, wherein the matching network is configured to match the signals amplified by the amplifiers with predetermined load values, and the matching network is configured to have a first impedance frequency response as a monotonically decreasing function of frequency of the signals amplified by the amplifiers in a target operation frequency range; arranging a converter network to connect with the matching network, wherein the converter network is configured to convert the signals matched by the matching network; and arranging an impedance flattening network to connect with the converter network, wherein the impedance flattening network is configured to have a second impedance frequency response as a monotonically increasing function of frequency of the amplified signals in the target operation frequency range.

Another embodiment discloses a wireless base station system. The wireless base station system comprises a set of baseband signal generating circuits; a transmission converter module configured to receive and convert baseband signals from the baseband signal generating circuits into transmission signals according to predetermined transmission frequencies; a wideband power amplifier configured to amplify the transmission signals received from the transmission converter module, wherein the wideband power amplifier comprises a set of amplifiers connected in parallel to amplify the transmission signals received from input ports of the amplifiers; a matching network configured to match the transmission signals amplified by the amplifiers with predetermined load values, the matching network having a first impedance frequency response as a monotonically decreasing function of frequency of the transmission signals; a converter network configured to convert the transmission signals matched by the matching network in a target operation frequency range; and an impedance flattening network having a second impedance frequency response as a monotonically increasing function of frequency of the transmission signals converted by the converter network in the target operation frequency range; and a radio signal transmission antenna module having antennas, wherein the radio signal transmission antenna module receives and transmits the transmission signals amplified by the wideband power amplifiers into air via the antennas.

DETAILED DESCRIPTION OF THE PREFERRED EMBODIMENTS

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

Some embodiments are based on recognition that a wideband power amplifier having an impedance flattening network improves the characteristics of the bandwidth and back-off efficiency of a Doherty power amplifier. The wideband power amplifier comprises a set of amplifiers connected in parallel to amplify signals from input ports of the amplifiers; a matching network configured to match the signals amplified by the amplifiers with predetermined load values, the matching network having a first impedance frequency response as a monotonically decreasing function of frequency of the amplified signals in a target operation frequency range; a converter network configured to convert the signals matched by the matching network; and an impedance flattening network having a second impedance frequency response as a monotonically increasing function of frequency of the amplified signals in the target operation frequency range.

Figure 4A:
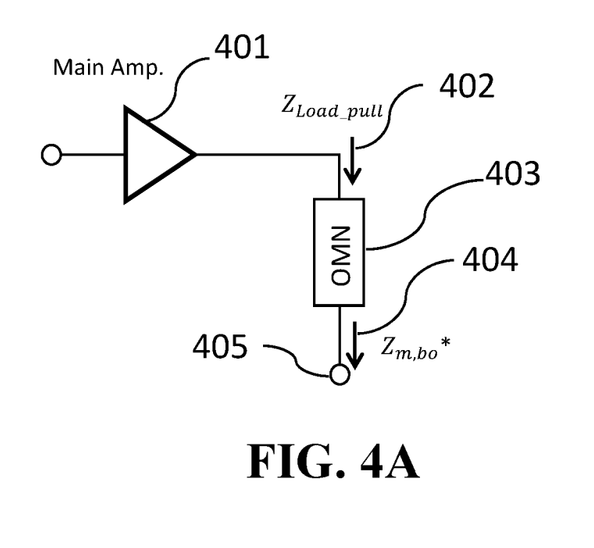
FIG. 4A shows an amplifier circuit including a main amplifier and an output matching network.
Figure 4B:
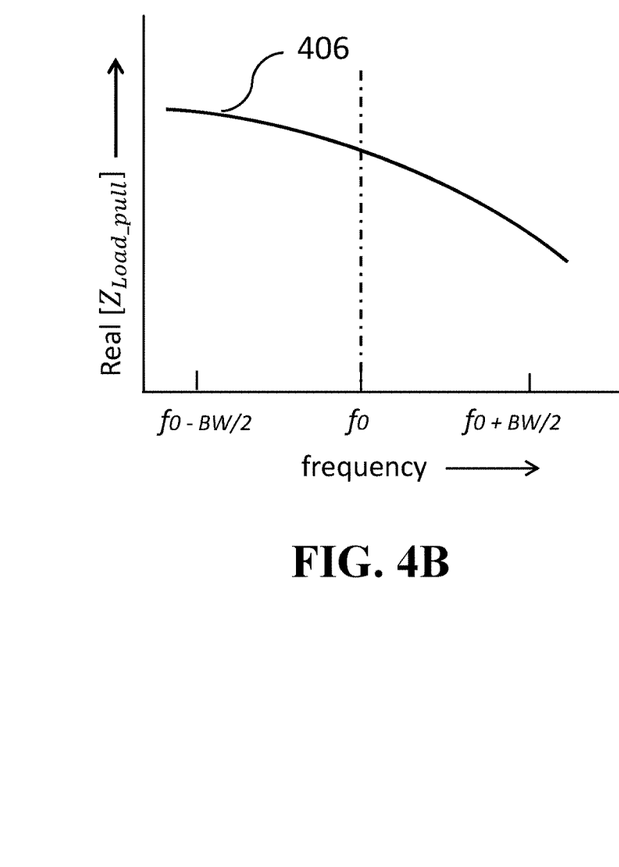
FIG. 4B shows an impedance frequency response of the amplifier circuit of FIG. 4A obtained at a $Z_{load\_pull}$ position.
Figure 4C:
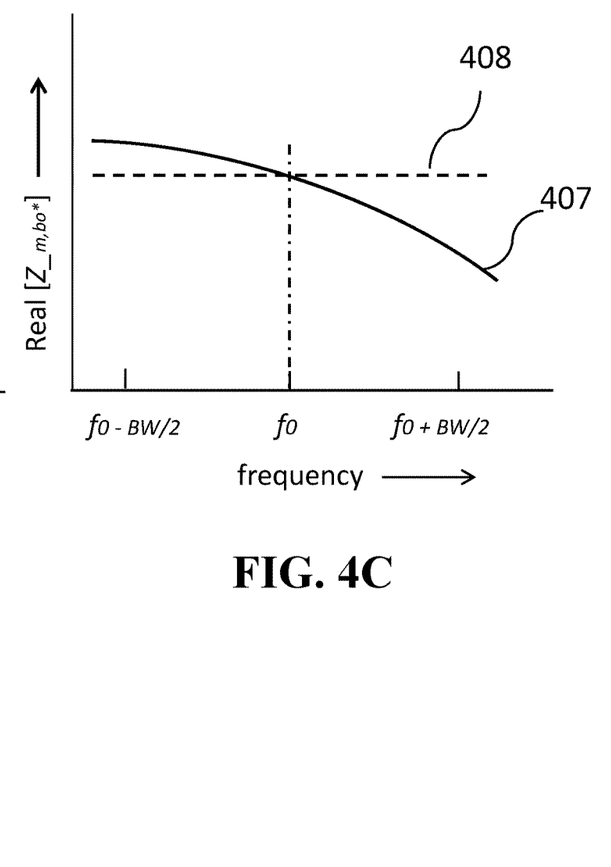
FIG. 4C shows an impedance frequency response of the amplifier circuit of FIG. 4A obtained at a $Z_{m,bo*}$ position.

FIG. 4A shows an amplifier circuit including a main amplifier and an output matching network. FIG. 4B shows an impedance frequency response of the amplifier circuit obtained at a $Z_{load\_pull}$ position 402. FIG. 4C shows an impedance frequency response of the amplifier circuit obtained at a $Z_{m,bo*}$ position.

FIGS. 4A-4C shows the realization of the $Z_{Load\_pull}$ 402 considering main amplifier and its typical frequency response curve 406 which has a decreasing behavior for Real $[Z_{load\_pull}]$ with the increase of frequency. Typically, this Real $[Z_{load\_pull}]$ 406 load is matched to the back-off impedance Real $[Z_{m,bo}]$ 201 through output matching network (OMN) 403 and the overall characteristic impedance at 405 terminal node is impacted by 406 response shape. This resultant characteristic is denoted by a $Z_{m,bo*}$ 404 and its frequency response is shown as a frequency response curve 407 in FIG. 4C. Note that the frequency response curve 407 deviates from the ideal back-off load condition 408 which limits the wideband operation of Doherty PA due to this improper impedance match, particularly, at the edge of fo−BW/2 and fo+BW/2 regions corresponding to in a target operation frequency range. The matching network 403 has an impedance frequency response that shows a monotonically decreasing function of frequency of the amplified signals in the target operation frequency range.

Therefore, some embodiments add an impedance flattening network in Doherty combiner to improve characteristic of the back-off load condition 408 at a terminal node 405 and to increase efficiency at back-off power over the entire bandwidth.

Figure 5A:
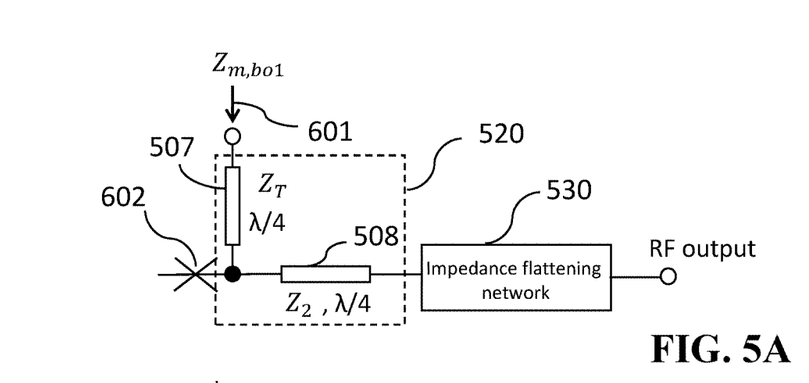
FIG. 5A shows a circuit diagram including an impedance flattening network connected to quarter-wave impedance converters.
Figure 5B:
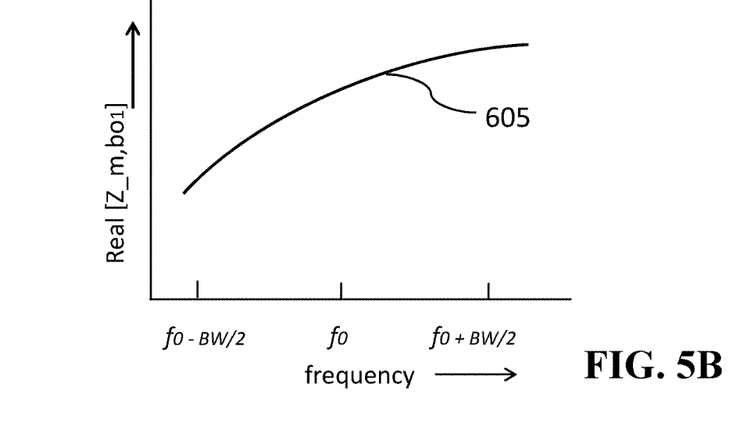
FIG. 5B shows an impedance frequency response of the impedance flattening network obtained at a $Z_{m,bol}$ position in FIG. 5A.

FIG. 5A shows a circuit diagram including an impedance flattening network connected to quarter-wave impedance converters, and FIG. 5B shows an impedance frequency response of the impedance flattening network obtained at a $Z_{m,bol}$ position in FIG. 5A.

FIG. 5A shows part of a combining network 520 connected to the impedance flattening network 530. The combining network 520 plays a role as a load modulation network at back-off together with the impedance flattening network 530.

FIG. 5B shows a typical frequency response of real part impedance 605 . . . . As is seen in the figure, the impedance Zm,boi 605 monotonically increases with the frequency in the target operation frequency range from fo−BW/2 to fo+BW/2, with center frequency f0 . . . . The increase in the impedance Z.,boi 605 in this frequency range is advantageous for correcting the decrease of the impedance ZLoad_pull and Zmbo* discussed above, and can provide a wideband response of a Doherty power amplifier with high efficiency.

Figure 6:
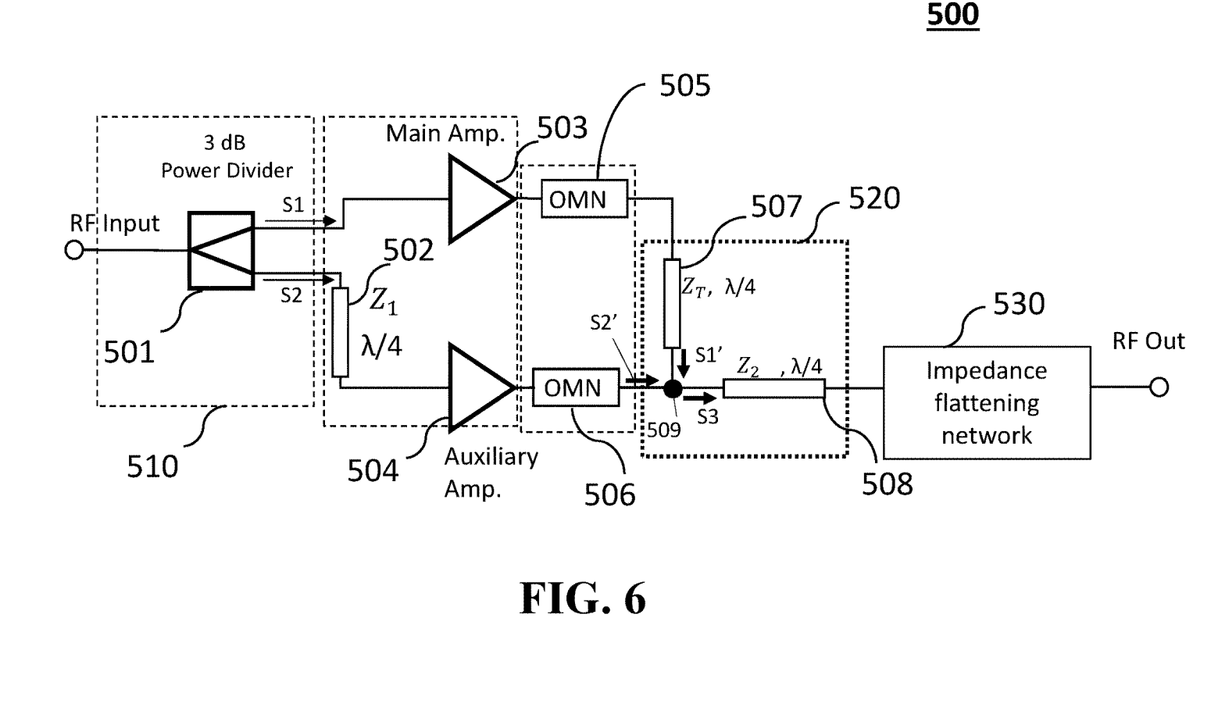
FIG. 6 shows a circuit diagram of a high frequency wideband Doherty power amplifier including the impedance flattening network.

FIG. 6 shows a high efficiency wideband Doherty power amplifier 500 according to some embodiments of the invention. The high efficiency wideband Doherty power amplifier 500 includes an RF input port, a power divider network 510 having a 3 dB power divider 501, an amplifier network including a main amplifier 503, an auxiliary amplifier 504 and a 14 transmission line Z1 502 connecting an output of the power divider network 510 and an input of the auxiliary amplifier 504, an impedance converter network including output matching networks (OMNs) 505 and 506, a combining network 520, and an impedance flattening network 530. In this case, the combining network 520 includes a 2/4 impedance inverter ZT 507 and a 2/4 impedance inverter Z2 508. Further, the power amplifier 500 can be disposed on a printed circuit board. In some embodiments, the impedance flattening network can be formed on another printed circuit board.

An RF signal is input from the RF input port and divided by the 3-dB power divider 501 of the power divider network 510 into a signal S1 and a signal S2 according to a design parameter of power ratio $R_{1/2}$=|S1|/|S2|, where |S1| represents a signal power of the signal S1 and |S2| represents a signal power of the signal S2. The signal S1 output from the 3 dB power divider 501 is input to the main amplifier 503 and amplified with a first preset amplification. The signal S1 amplified is input to the OMN 505 and goes through the λ/4 impedance inverter $Z_T$ 507 of the combining network 520, and then is output from the λ/4 impedance inverter $Z_T$ 507 as a signal S1'.

After being output from the 3 dB power divider 501, the signal S2 is going through the λ/4 transmission line $Z_1$ 502 and input to the auxiliary amplifier 504. The signal S2 amplified by the auxiliary amplifier 504 is input to the output matching network 506 and output as a signal S2'.

The signals S1' and S2' are combined at a node 509 and input to the λ/4 impedance inverter $Z_2$ 508 of the combining network 520 as a signal S3. The signal S3 is inverted through the λ/4 impedance inverter $Z_2$ 508 and input to the impedance flattening network 530 and output to the RF out port.

According to embodiments of the invention, compared to the traditional wideband Doherty PA architecture, the new architecture of embodiments of the invention can be designed smaller because the form factor of the impedance flattening network is compact since there is no need to use complicated calibration or control network. This also helps to reduce the overall heat dissipation of the amplifier.

Figure 7:
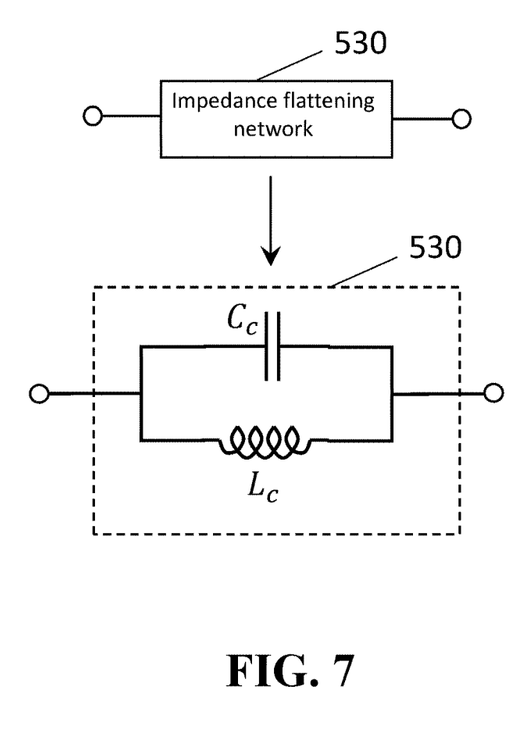
FIG. 7 shows an embodiment to realize the impedance flattening network.

FIG. 7 shows an example of an impedance flattening network 530 expressed by a capacitor $C_c$ and inductor $L_c$ parallel tank according to some embodiments of the invention. In this case, the capacitor $C_c$ and inductor $L_c$ are connected in parallel configuration. The relation between these two parameters is given below:

$$L_c = \frac{1}{4\omega_0^2 C_c}$$

where, $\omega_0=2\pi f_0$ and $f_0$=center RF frequency.

In designing of the impedance flattening network 530, values of the capacitor C, and the inductor L, can be chosen so as to respond to a frequency of 2fo. In this case, each of the capacitor C, and the inductor L, can be chosen to include parasitic impedance so that circuit parasitics are compensated and the power efficiency and frequency response range are maximized.

In other words, in some embodiments, the impedance flattening network 530 is configured to include a resonator chosen to have a resonance frequency at a second harmonic frequency of an operation center frequency $f_0$ of the wideband power amplifier.

The impedance flattening network 530 is designed so as to create an opposite characteristic of the frequency response curve 407 in FIG. 4C so that the resultant performance approaches the ideal back-off load condition 408 indicated with a dashed line in FIG. 4C. This enables to achieve a wideband performance of Doherty PA.

According to some embodiments of the invention, cost reduction can be achieved in the implementation of power amplifier for next generation wireless communications. The impedance flattening network helps to improve the bandwidth and back-off efficiency of the Doherty PA. Bandwidth enhancement provides use of a single power amplifier instead of several for the multi-band operation. This provides cut-down of the implementation cost of PA significantly. In addition, efficiency improvement at back-off power reduces the heat dissipation by the PA, which leads to cost reduction to design the heat sink and cooling system.

Figure 8A:
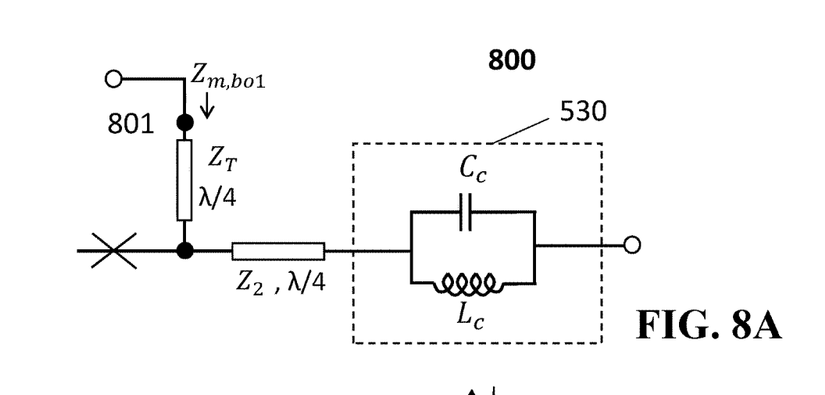
FIG. 8A shows an impedance flattening circuit connected to quarter-wave impedance converters.
Figure 8B:
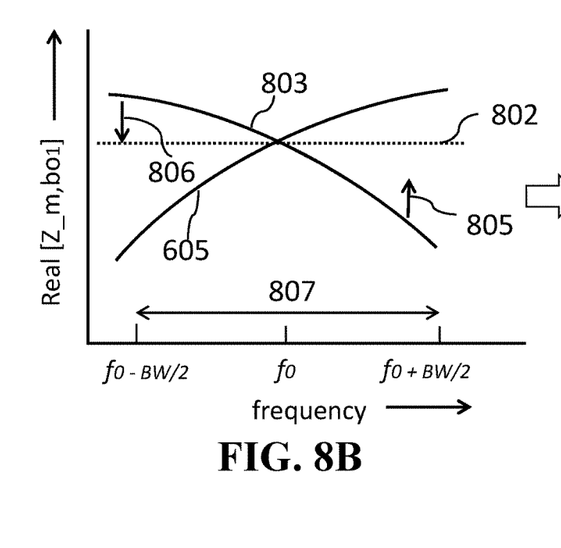
FIG. 8B shows impedance frequency responses of the output matching network of FIG. 4C and the impedance flattening network connected to the quarter-wave impedance converters.

FIG. 8A shows a simplified diagram of a back-off load modulation network 800 according to some embodiments of the invention. FIG. 8B shows a frequency response of the back-off load modulation network 800. In this case, the auxiliary PA 504 is biased at a class C mode, and the auxiliary PA 504 is turned off at a back-off power region. As a result, a signal path from the auxiliary PA 504 to the impedance element Z2 508 becomes open circuit 602 resulting disconnection from the overall configuration. A frequency response curve 803 represents the real part of the impedance [Z m,bol] at back-off power seen by the main PA.

Typically PAs at RF frequencies are designed based on load-pull results to get maximum power added efficiency within output power requirement. If we closely look at the characteristic of load-pull impedance across the frequency; For instance, the power amplifiers can be gallium-nitride (GaN) material based transistors, e.g. GaN High Electron Mobility Transistors or GaN material base Hetero-Bipolar- Transistors (HBTs). Some references are seen in datasheets CGH40010 and CGH40025 regarding GaN High Electron Mobility Transistors published by CREE, Inc.; This can be interpreted as a result of the output equivalent circuits of a RF power transistor being a parallel combination between output channel resistance (Rds in the case of field effect transistor) and output parasitic capacitances (Cout). And, the frequency response of this network shows the decrease of the real part of impedance.

Figure 8C:
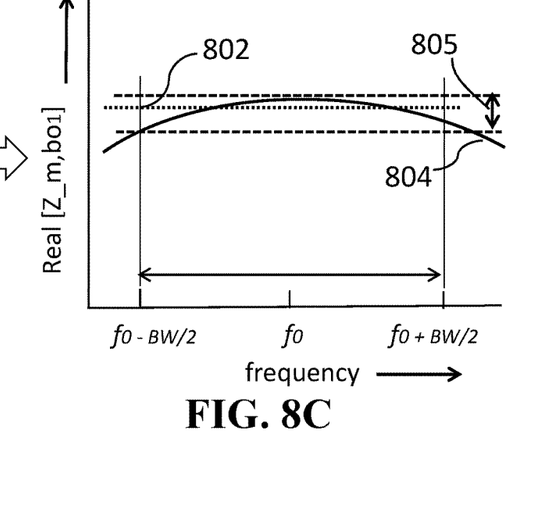
FIG. 8C shows a flattening effect of an impedance frequency response obtained by synthesizing the impedance flattening network and the output matching network connected to the main amplifier.

The resultant configuration with the parallel connected L-C network and frequency responses at different nodes are shown in FIGS. 8A-8C. The inclusion of the L-C network with rest of the Doherty PA architecture creates distinct impedance characteristics at node 801 which are suitable for the proper operation of wideband Doherty PA. First this impedance flattening network creates a gain modification of Real $[Z\_{m,bo_l}]$ with respect to center frequency by creating a high impedance condition at second harmonic. So before connecting the impedance flattening network the characteristic of Real $[Z\_m,bo_l]$ was a frequency response 803 and after its inclusion, it starts to pull-down the Real $[Z\_{m,bo^*}]$ 404 from $f_o-BW/2$ to $f_o$ and pull-up the Real $[Z\_{m,bo^*}]$ from $f_o$ to $f_o+BW/2$. The resultant characteristic of Real $[Z\_{m,bo_l}]$ is shown as a frequency response curve 804 in FIG. 8C. According to embodiments of the invention, a fluctuation of the frequency response curve 804 can be controlled in a threshold value 805 in the target operation frequency range between $f_o-BW/2$ and $f_o+BW/2$. It should be noted that the frequency response curve 804 is substantially a constant in the target operation frequency range of $f_o-BW/2$ and $f_o+BW/2$.

Since the Real $[Z\_{m,bol}]$ at back-off is now less dependent of frequency across the entire bandwidth, the realized Doherty PA exhibits wideband performance. Second, it also helps to compensate the reactive part at node 801. Typically, the output impedance of any device is capacitive or negative reactance and this reactance can be matched to its proper value to extract maximum power added efficiency from Doherty PA. In practice, matching network with single/multiple stage is usually used to match the reactive part but in this case the impedance flattening network is capable to compensate the reactive part according to requirements by selecting proper values of capacitor and inductor which to improve overall efficiency.

According to some embodiments, components of the impedance flattening network 530 can be selected such that a fluctuation of a frequency in a combination of the first and the second impedance frequency responses is less than a threshold value 805 indicated in FIG. 8C. In other words, the frequency response of a combination of the matching network 505 and the impedance flattening network 530 is substantially a constant in the target operation frequency range of $f_o-BW/2$ and $f_o+BW/2$.

As discussed above, the impedance flattening network 530 includes the resonator chosen to have the resonance frequency at a second harmonic frequency $2f_0$ of the operation center frequency $f_0$ of the wideband power amplifier, and it should be noted that the frequency $f_o+BW/2$ in the target operation frequency range is chosen to be equal or less than the second harmonic frequency $2f_0$.

Further, the impedance flattening network 530 is connected between the converter network 520 and an output port of the power amplifier 500. In addition, the converter network 520 includes quarter wave transmission impedance converters as shown in FIG. 6.

In some embodiments, the impedance flattening network 530 can be designed to include a resonator having a parallel of an inductance Lc and a capacitance Cc, wherein the resonator is chosen to have a resonance frequency at a second harmonic frequency of an operation center frequency $f_o$ of the wideband power amplifier 500. In this case, the capacitance C can be formed of an air gap of electrodes or a variable capacitor. Further, the capacitance C can be formed of a capacitor of a micro electro mechanical system (MEMS).

Figure 9:
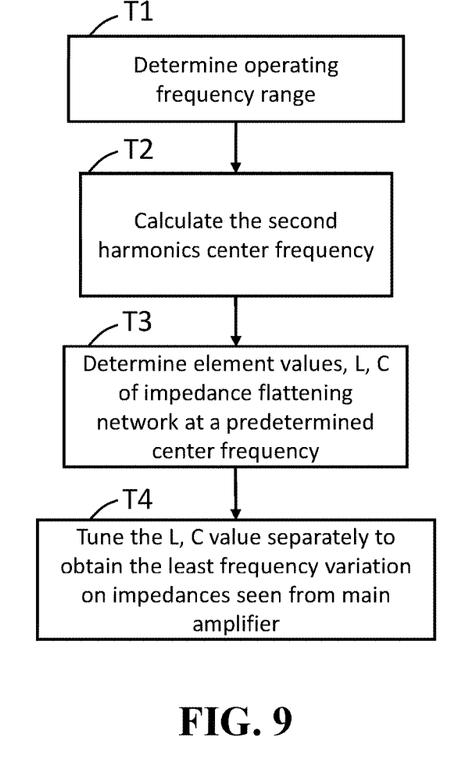
FIG. 9 shows a block diagram of a method for designing the impedance flattening network.

FIG. 9 shows a block diagram of a method for designing the impedance flattening network. After determining an operating frequency range in step T1, a second harmonics center frequency is calculated in step T2. In step T3, for a predetermined center frequency, element values L and C of the impedance flattening network are determined. In step T4, each of the values L and C is separately tuned to obtain the least frequency variation on impedances seen from a main amplifier.

In some embodiments, a method of designing a wideband power amplifier network includes steps of arranging a set of amplifiers connected in parallel to amplify signals from input ports of the amplifiers, arranging a matching network to connect with the amplifiers, wherein the matching network is configured to match the signals amplified by the amplifiers with predetermined load values, and the matching network is configured to have a first impedance frequency response as a monotonically decreasing function of frequency of the signals amplified by the amplifiers in a target operation frequency range, arranging a converter network to connect with the matching network, wherein the converter network is configured to convert the signals matched by the matching network; and arranging an impedance flattening network to connect with the converter network, wherein the impedance flattening network is configured to have a second impedance frequency response as a monotonically increasing function of frequency of the amplified signals in the target operation frequency range.

Figure 10:
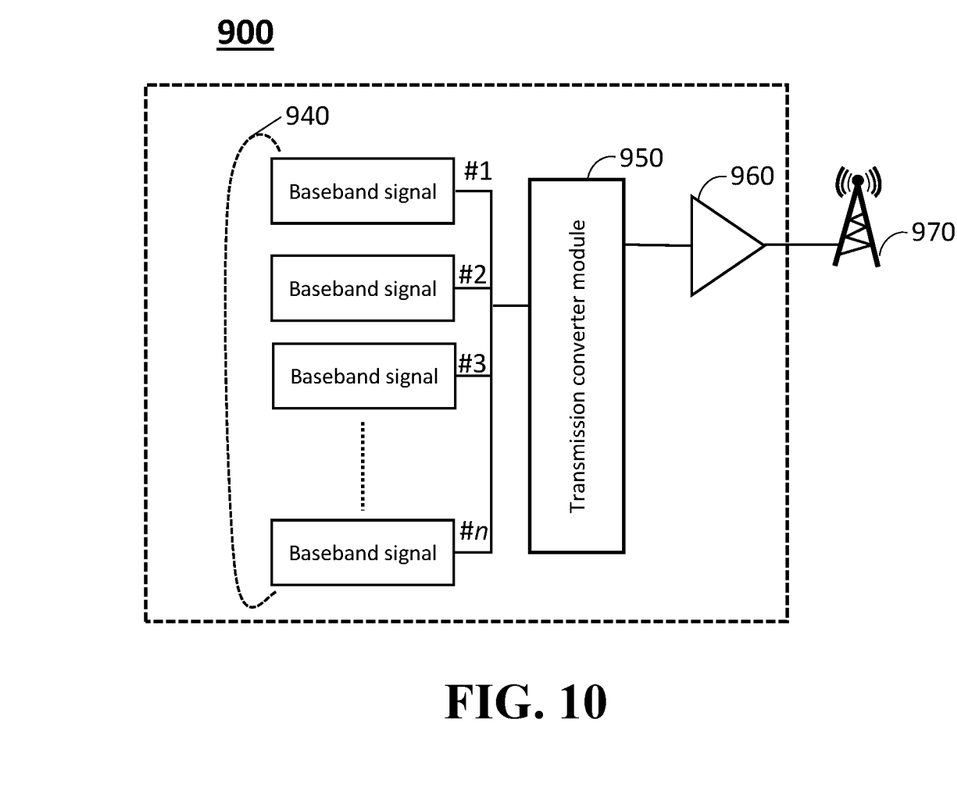
FIG. 10 shows a cellular base station system including transmission converter module and the high frequency wideband Doherty power amplifier including the impedance flattening network for multi-band transmission.

FIG. 10 shows a RF base station system 900 including transmission converter module and the high frequency wideband Doherty power amplifier including the impedance flattening network.

The RF base station system 900 includes baseband signal generators 940. Each of the baseband signal generators 940 is connected to a transmission converter module 950. The transmission converter module 950 generates RF signals #1~n of the baseband signals 940 with different frequencies and transmits the RF signals to an RF power amplifier circuit 960 having an impedance flattening network 530. After receiving the RF signals, the RF power amplifier circuit 960 amplified the RF signals and transmits in the air via an antenna 970. According to some embodiments of the invention, the RF signals #1~n of the baseband signals 940 are effectively amplified for a predetermined frequency range.

In some embodiments, a wireless base station system includes a set of baseband signal generating circuits, a transmission converter module configured to receive and convert baseband signals from the baseband signal generating circuits into transmission signals according to predetermined transmission frequencies, a wideband power amplifier configured to amplify the transmission signals received from the transmission converter module, wherein the wideband power amplifier comprises a set of amplifiers connected in parallel to amplify the transmission signals received from input ports of the amplifiers, a matching network configured to match the transmission signals amplified by the amplifiers with predetermined load values, the matching network having a first impedance frequency response as a monotonically decreasing function of frequency of the transmission signals in a target operation frequency range, a converter network configured to convert the transmission signals matched by the matching network, and an impedance flattening network having a second impedance frequency response as a monotonically increasing function of frequency of the transmission signals converted by the converter network in the target operation frequency range, and a radio signal transmission antenna module having antennas, wherein the radio signal transmission antenna module receives and transmits the transmission signals amplified by the wideband power amplifiers into air via the antennas.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A wideband power amplifier, comprising:
   a set of amplifiers connected in parallel to amplify signals from input ports of the amplifiers;
   a matching network configured to match the signals amplified by the amplifiers with predetermined load values, the matching network having a first impedance frequency response as a monotonically decreasing function of frequency of the amplified signals in a target operation frequency range;
   a converter network configured to convert the signals matched by the matching network; and
   an impedance flattening network having a second impedance frequency response as a monotonically increasing function of frequency of the amplified signals in the target operation frequency range.

2. The amplifier of claim 1, wherein components of the impedance flattening network are selected such that a fluctuation of a frequency in a combination of the first and the second impedance frequency responses is less than a threshold value.

3. The amplifier of claim 1, wherein the frequency in a combination of the first and the second impedance frequency responses is substantially a constant.

4. The amplifier of claim 1, wherein the impedance flattening network is connected between the converter network and an output port of the power amplifier.

5. The amplifier of claim 1, wherein the converter network includes quarter wave transmission impedance converters.

6. The amplifier of claim 5, wherein at least one of the quarter wave transmission impedance converters is designed for a central frequency of the wideband power amplifier.

7. The amplifier of claim 1, wherein a reactance of the impedance flattening network is substantially zero.

8. The amplifier of claim 1, wherein the impedance flattening network includes a resonator having a parallel of an inductance L and a capacitance C, wherein the resonator is chosen to have a resonance frequency at a second harmonic frequency of an operation center frequency of the wideband power amplifier.

9. The amplifier of claim 8, wherein the capacitance C is formed of an air gap of electrodes or a variable capacitor.

10. The amplifier of claim 8, wherein the capacitance C is formed of a capacitor of a micro electro mechanical system.

11. The amplifier of claim 1, further comprising:
    a signal power divider configured to divide an input signal into first and second signals by a predetermined signal power ratio.

12. The amplifier of claim 11, wherein the set of amplifiers comprises:
    a main amplifier configured to receive and amplify the first signal; and
    a peak amplifier configured to receive and amplify the second signal.

13. The amplifier of claim 12, wherein the matching network includes quarter wave transmission impedance converters configured to receive the first and second amplified signals.

14. The amplifier of claim 1, wherein the amplifier network includes gallium-nitride (GaN) material based transistors.

15. The amplifier of claim 1, wherein the impedance flattening network is formed on a printed circuit board.

16. A method of designing a wideband power amplifier network, the method comprising steps of:
    arranging a set of amplifiers connected in parallel to amplify signals from input ports of the amplifiers;
    arranging a matching network to connect with the amplifiers, wherein the matching network is configured to match the signals amplified by the amplifiers with predetermined load values, and the matching network is configured to have a first impedance frequency response as a monotonically decreasing function of frequency of the signals amplified by the amplifiers in a target operation frequency range;
    arranging a converter network to connect with the matching network, wherein the converter network is configured to convert the signals matched by the matching network; and
    arranging an impedance flattening network to connect with the converter network, wherein the impedance flattening network is configured to have a second impedance frequency response as a monotonically increasing function of frequency of the amplified signals in the target operation frequency range.

17. A wireless base station system, comprising:

a set of baseband signal generating circuits;

a transmission converter module configured to receive and convert baseband signals from the baseband signal generating circuits into transmission signals according to predetermined transmission frequencies;

a wideband power amplifier configured to amplify the transmission signals received from the transmission converter module, wherein the wideband power amplifier comprises:

a set of amplifiers connected in parallel to amplify the transmission signals received from input ports of the amplifiers;

a matching network configured to match the transmission signals amplified by the amplifiers with predetermined load values, the matching network having a first impedance frequency response as a monotonically decreasing function of frequency of the transmission signals in a target operation frequency range;

a converter network configured to convert the transmission signals matched by the matching network; and     an impedance flattening network having a second impedance frequency response as a monotonically increasing function of frequency of the transmission signals converted by the converter network in the target operation frequency range; and a radio signal transmission antenna module having antennas, wherein the radio signal transmission antenna module receives and transmits the transmission signals amplified by the wideband power amplifiers into air via the antennas.

\* \* \* \* \*